US010635063B2

(12) United States Patent
Beyer et al.

(10) Patent No.: US 10,635,063 B2
(45) Date of Patent: *Apr. 28, 2020

(54) SYSTEMS AND METHODS FOR HIGHLY PARALLEL PROCESSING OF PARAMETERIZED SIMULATIONS

(75) Inventors: Kevin S. Beyer, San Francisco, CA (US); Vuk Ercegovac, Campbell, CA (US); Peter Haas, San Jose, CA (US); Eugene J. Shekita, San Jose, CA (US); Fei Xu, Bellevue, WA (US)

(73) Assignee: INTERNATIONAL BUSINESS MACHINES CORPORATION, Armonk, NY (US)

(*) Notice: Subject to any disclaimer, the term of this patent is extended or adjusted under 35 U.S.C. 154(b) by 690 days.

This patent is subject to a terminal disclaimer.

(21) Appl. No.: 13/595,446

(22) Filed: Aug. 27, 2012

(65) Prior Publication Data

US 2012/0323551 A1    Dec. 20, 2012

Related U.S. Application Data

(63) Continuation of application No. 12/826,077, filed on Jun. 29, 2010.

(51) Int. Cl.
*G05B 17/02* (2006.01)
*G06F 17/50* (2006.01)

(52) U.S. Cl.
CPC .......... *G05B 17/02* (2013.01); *G06F 17/5009* (2013.01)

(58) Field of Classification Search
CPC ................... G06F 7/582; G06F 7/588
See application file for complete search history.

(56) References Cited

PUBLICATIONS

Maigne et al. "Parallelization of Monte Carlo Simulations and Submission to a Grid Environment", 2004, Parallel Processing Letters, vol. 14, No. 2, pp. 177-196.*
Pandey, Niraj. "Implementation of LEap Ahead Function for Linear Congruential and Lagged Fibonacci Generators", 2008, 83 pages.*
Coddington, Paul D., "Analylsis of random number generators using Monte Carlo simulation", Northeast Parallel Architecture Center, Syracuse University Surface, L.C. Smith College of Engineering and Computer Science, Jan. 1, 1994, 16 pages, Paper No. 14, Syracuse, New York, United States.

* cited by examiner

*Primary Examiner* — Suzanne Lo
(74) *Attorney, Agent, or Firm* — Ference & Associates LLC

(57) ABSTRACT

Systems and associated methods for highly parallel processing of parameterized simulations are described. Embodiments permit processing of stochastic data-intensive simulations in a highly parallel fashion in order to distribute the intensive workload. Embodiments utilize methods of seeding records in a database with a source of pseudo-random numbers, such as a compressed seed for a pseudo-random number generator, such that seeded records may be processed independently in a highly parallel fashion. Thus, embodiments provide systems and associated methods facilitating quicker data-intensive simulation by enabling highly parallel asynchronous simulations.

11 Claims, 6 Drawing Sheets

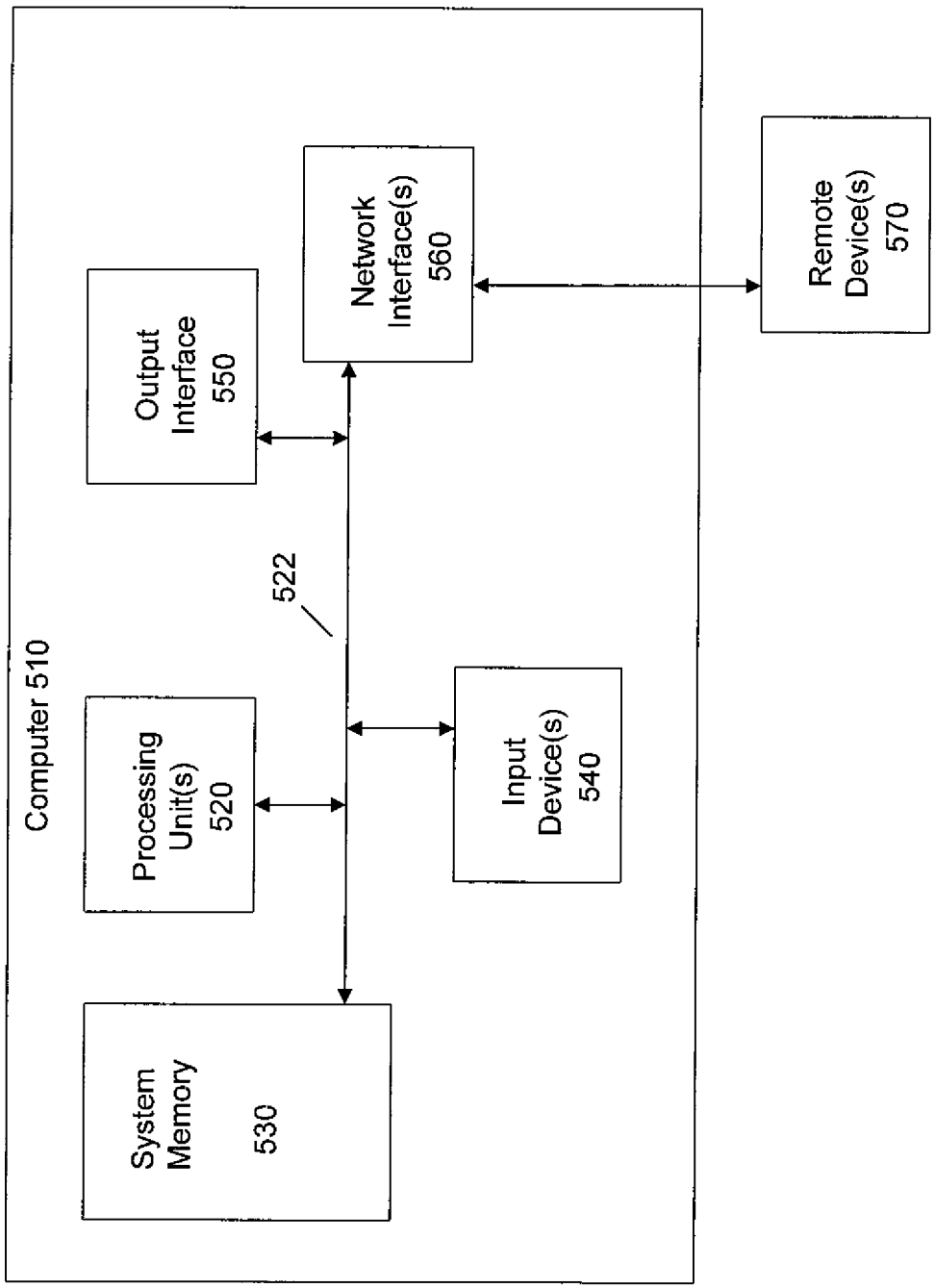
FIG. 5 - PRIOR ART

SYSTEMS AND METHODS FOR HIGHLY PARALLEL PROCESSING OF PARAMETERIZED SIMULATIONS

CROSS REFERENCE TO RELATED APPLICATION

The application is a continuation of U.S. patent application Ser. No. 12/826,077, entitled METHODS AND SYSTEMS FOR HIGHLY PARALLEL PROCESSING OF PARAMETERIZED SIMULATIONS, filed on Jun. 29, 2010, which is incorporated by reference in its entirety.

BACKGROUND

The subject matter described herein generally relates to parallel processing of a plurality of stochastic simulations, wherein the behavior of each simulation depends upon a set of input parameter values.

Parallel computing involves executing many calculations simultaneously using the principle that large problems can be divided into smaller ones and solved concurrently. One or more computing devices (computers, servers, et cetera) are often employed to carry out parallel computations. Various hardware arrangements support parallelism, for example a multi-core or multi-processor computer having multiple processing elements within a single machine, or clusters of multiple computers arranged to participate in executing parallel computing tasks. The well known Hadoop software system, for example, allows robust parallel processing over a cluster of thousands of commodity machines.

Stochastic simulation is a numerical technique for predicting or studying the behavior of systems or phenomena that are characterized by randomness. For such systems, the "performance measures" of interest, such as the future price of a stock option or the predicted insulin level of a patient after taking a prescription drug, are described by a probability distribution over the possible values of the performance measure. Simulation is used when this probability distribution is too complex to be computed analytically, and proceeds by repeatedly generating pseudo-random samples from the probability distribution of interest.

The process of generating an individual sample is called a Monte Carlo replication, and may involve a complicated series of computations. The Monte Carlo replications are used to estimate important characteristics of the probability distribution. For example, the expected value of the probability distribution can be estimated by the average of the Monte Carlo samples. In practice, pseudo-random numbers are used to emulate the randomness of a real-world system on a computer. A stream (sequence) of pseudo-random integers, called seeds, is generated according to a deterministic algorithm, but the algorithm is designed so that the sequence of seeds appears random to an observer. For example, the seed sequence will pass standard statistical tests for randomness. The sequence of seeds is usually transformed via simple numerical operations into to a sequence of pseudo-random uniform numbers that are then used in the simulation.

Exploiting the fact that different Monte Carlo replications can be computed independently of each other, traditional parallel simulation techniques attempt to speed up simulation processing by executing the Monte Carlo replications for the system in parallel, and sometimes also by decomposing the system to be simulated into disjoint components that can be simulated in parallel. In this approach, the degree of parallelism is equal to the number of available processors, which can range from tens to thousands. In general, the behavior of a simulation depends on a plurality of input parameters; in the traditional parallel setting, a set of parameters is associated with each parallel processor. The amount of "seeding" information used to provide a stream of pseudo-random numbers at a processor may be large.

BRIEF SUMMARY

Embodiments broadly contemplate systems and associated methods for highly parallel processing of parameterized simulations. Embodiments permit processing of stochastic data-intensive simulations in a highly parallel fashion in order to distribute the intensive workload. Embodiments utilize methods of seeding records in a database with a source of pseudo-random numbers, such as a compressed seed for a pseudo-random number generator, such that seeded records may be processed independently in a highly parallel fashion. Thus, embodiments provide systems and associated methods facilitating quicker data-intensive simulation by enabling highly parallel asynchronous simulations. Because the simulation parameters are associated with a record instead of a fixed processor, as is done traditionally, and because the source of pseudo-random numbers needed for the simulation associated with a record is stored in a compact manner within the record itself, the simulation workload can be distributed among processors in a flexible and dynamic manner. Besides being more efficient and allowing better load balancing when compared to conventional techniques, overall processing is more robust (for example, handling failure of processing nodes) since the records (for example, at a failed node) can be moved to, or duplicated at, a different, functioning node.

In summary, one aspect provides a method comprising: assigning records of a database for seeding; seeding each record, said seeding further comprising adding a unique source of pseudo-random numbers to each record; and providing seeded records to a plurality of processing nodes for parallel asynchronous simulations.

The foregoing is a summary and thus may contain simplifications, generalizations, and omissions of detail; consequently, those skilled in the art will appreciate that the summary is illustrative only and is not intended to be in any way limiting. For a better understanding of the embodiments, together with other and further features and advantages thereof, reference is made to the following description, taken in conjunction with the accompanying drawings. The scope of the invention will be pointed out in the appended claims.

BRIEF DESCRIPTION OF THE SEVERAL VIEWS OF THE DRAWINGS

FIG. 5 illustrates an example computer system.

DETAILED DESCRIPTION

Figure 1:
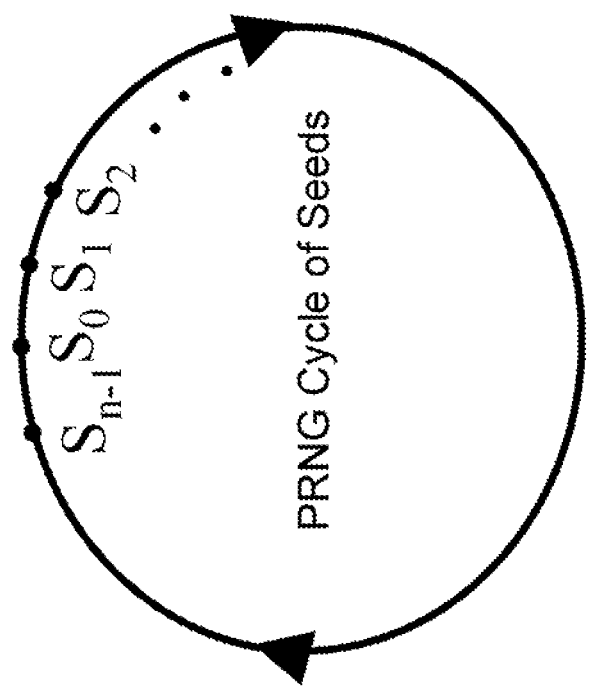
FIG. 1 illustrates an example pseudo-random number generator cycle of seeds.

It will be readily understood that the components of the embodiments, as generally described and illustrated in the figures herein, may be arranged and designed in a wide variety of different configurations in addition to the described example embodiments. Thus, the following more detailed description of the example embodiments, as represented in the figures, is not intended to limit the scope of the claims, but is merely representative of those embodiments.

Reference throughout this specification to "embodiment(s)" (or the like) means that a particular feature, structure, or characteristic described in connection with the embodiment is included in at least one embodiment. Thus, appearances of the phrases "according to embodiments" or "an embodiment" (or the like) in various places throughout this specification are not necessarily all referring to the same embodiment.

Furthermore, the described features, structures, or characteristics may be combined in any suitable manner in one or more embodiments. In the following description, numerous specific details are provided to give a thorough understanding of example embodiments. One skilled in the relevant art will recognize, however, that aspects can be practiced without one or more of the specific details, or with other methods, components, materials, et cetera. In other instances, well-known structures, materials, or operations are not shown or described in detail to avoid obfuscation.

In this regard, although specific, non-limiting example use contexts are provided herein to facilitate understanding of certain aspects of the invention, as claimed, the embodiments are not so limited. Thus, embodiments broadly provide systems and associated methods for highly parallel processing of parameterized simulations in addition to the chosen examples described herein. It should therefore be understood by those having ordinary skill in the art that embodiments generally permit processing of data-intensive simulations in a highly parallel fashion via seeding records, and providing these seeded records to processing nodes for asynchronous, parallel simulations, even though specific example embodiments are described herein with respect to running a specific type of simulation (Monte Carlo) in parallel.

As modern enterprises have begun to collect and analyze massive amounts of data for purposes of risk assessment and decision-making, the need to predict massive numbers of uncertain performance measures has led to the need for a new kind of data-intensive simulation. In this setting, millions or billions of simulations need to be run. Each such simulation involves the generation of hundreds or thousands of Monte Carlo replications, and has its own set of input parameters. The input parameters are often stored as a record in a database, so that each record gives rise to an individual simulation.

As one example, one may wish to predict the expected insulin levels at some future time point for each individual in the United States, based on a stochastic model of insulin level change over time. One might therefore need to generate hundreds of Monte Carlo replications for each individual. The input parameters for an individual might be stored as a record in a database and include factors such as age, weight, and dietary information. It is clearly desirable to be able to simulate the patients in parallel.

Another example is provided by the Monte Carlo Database System (MCDB) for executing Business Intelligence (BI) queries over uncertain data in a relational database. Besides uncertainty arising from the need to predict future data values, as discussed above, data containing uncertainty is becoming more prevalent due to the increasing use of data integration, the increasing use of automated information extraction, the making of data anonymous for privacy protection, as well as the growing prevalence of radio frequency identification (RFID) and sensor data.

In the MCDB system, a probability distribution is associated with the uncertain data values in the database. The user specifies variable generation (VG) functions, which are used to generate samples of the uncertain data values. Conceptually, an overall Monte Carlo replication is obtained by generating a sample for each uncertain data value and then running the BI query of interest over the resulting instance of the database. This process is repeated multiple times, resulting in a set of samples from the probability distribution of the query result.

These samples are then used to estimate properties of the query-result distribution, such as the expected value or variance of the query result. MCDB actually proceeds by performing an independent simulation for each record in the database that contains one or more uncertain values; this simulation comprises a plurality of Monte Carlo replications. The simulation for each such record is in general parameterized by a set of values tailored to the record. Because the computational requirements of MCDB are extremely large, it is desirable to parallelize such computations. An extensive description of the MCDB System can be found at: R. Jampani, F. Xu, M. Wu, L. L. Perez, C. M. Jermaine, and P. J. Haas. *MCDB: a Monte Carlo approach to managing uncertain data*, ACM SIGMOD, pages 687-700, 2008, incorporated by reference here.

The inventors have recognized that data-intensive simulations, which include a large amount of processing workload, can benefit from parallelization. However, existing systems and methods for executing parallel simulations are not currently capable of flexibly parameterizing simulations or achieving a sufficiently high degree of parallelism. Accordingly, embodiments are described herein that flexibly provide a high degree of parallelism for processing data-intensive simulations.

Embodiments employ methods for highly parallel processing of parameterized simulations. Each simulation can be parameterized according to the values in a corresponding database record. The database may be a relational database, a flat file of data, a collection of data in Javascript Object Notation (JSON) format, a multidimensional array of data values, and so forth. An example method for parallel execution of multiple simulations, as described further herein includes: assigning each record to exactly one of n parallel-processing nodes for seeding; seeding the records, where the nodes seed their assigned records asynchronously and in parallel (where seeding a record may amount to adding one or more compressed pseudo-random number seeds to the record); assigning each seeded record to exactly one of m parallel-processing nodes for simulation; and executing one simulation per seeded record, asynchronously and in parallel at each node, where the nodes expand the compressed pseudo-random number seed prior to simulation execution.

An alternative embodiment assigns each record to a plurality of nodes, with each node executing a subset of the total (Monte Carlo) replications for the simulation associated with the seeded record. Once the simulations are run, the results can be recorded and queries, visualizations, or other processing can be executed over the results.

The generation of pseudo-random numbers is a component of simulations described herein. The pseudo-random numbers provide (statistically) random values for use in the simulations. Accordingly, a brief overview of pseudo-random number generators (PRNG) follows.

Usually, a PRNG is initiated with a starting seed $s_0$, and then generates a sequence of seeds $s_1, s_2, \ldots$ by using a deterministic recursion of the form $s_{i+1}=T_1(s_i)$. At each step, the generator typically uses a second transformation to create a (typically 32-bit) integer $r_i=T_2(s_i) \in \{1, 2, \ldots, 2^{32}-1\}$, which is further transformed to a pseudo-random uniform number $u_i$ on [0, 1] via normalization: $u_i=r_i/2^{32}$. The transformations $T_1$ and $T_2$ depend on the specific generator, as do the number of bits in each $s_i$ (typically a multiple of 32). For a good generator, the sequence $u_1, u_2, \ldots$ is statistically indistinguishable from a sequence of "true" i.i.d. samples from the uniform[0, 1] distribution, in the sense that the sequence will pass statistical tests for uniformity and randomness. The uniform pseudo-random numbers can then be transformed into pseudo-random numbers having a user-specified distribution.

As illustrated in FIG. 1, the sequence of seeds $s_0, s_1, s_{n-1}$ produced by a PRNG eventually loops back on itself; that is, $s_N=s_O$ for some number N with $s_i \neq s_j$ for $0 \leq i < j < N$, thus forming a cycle of seeds. The number N is called the cycle length of the PRNG.

When a simulation is executed for a given record, the simulation procedure is "fed" an initial seed $s_i$ that was originally attached to the record during the seeding phase. The simulation procedure then calls a PRNG multiple times to consume a sequence of k seeds $s_i, s_{i+1}, \ldots, s_{i-k}$ during the course of the simulation. Depending on the simulation routine, the number k of seeds consumed might not be easily predictable in advance. For example, functions that use "acceptance-rejection" methods to generate non-uniform random variates use a "random" number of seeds.

Figure 2:
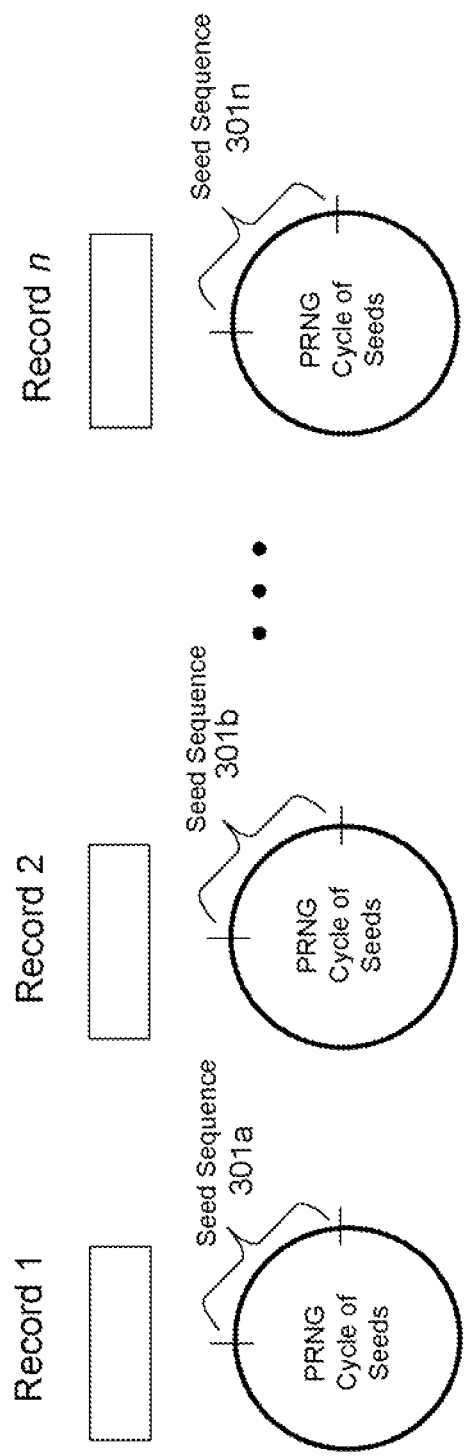
FIG. 2 illustrates example records and their respective pseudo-random number generator cycles of seeds.

As illustrated in FIG. 2, it is necessary that the seed sequences (301a, 301b, ... 301n) for the records (Record 1, Record 2, ... Record n) be mutually disjoint, since overlaps cause unintended statistical dependencies between records (Record 1, Record 2, ... Record n), which can lead to incorrect simulation results. Since the number of records can run to the billions, and each record can consume millions of seeds, the cycle length of the underlying PRNG must be very long. Fortunately, state-of-the-art PRNGs can achieve cycle lengths of $2^{500}$ and longer, while retaining good statistical properties.

A problem in terms of parallelization, however, is that these long cycle lengths are achieved by using very long seeds, which can greatly inflate the size of the records. Such inflation can significantly slow down processing by inducing large processing overheads when moving the data around for parallelization. Still further, for parallelization as per the example embodiments discussed herein, even more random number streams are needed than the number of records. For example, using the intra-record parallelism scheme (described further herein), both seeding and subsequent stream generation must be done in a highly parallelizable manner. A substantial literature has developed around the problem of generating pseudo-random number streams in parallel, largely motivated by scientific applications. Unfortunately, none of the previously proposed methods is directly applicable for a variety of reasons.

For example, in many prior algorithms the number of streams needed coincides with the number of processors, and hence is on the order of $10^1$ to $10^3$. However, parallelization on the order contemplated by embodiments herein requires on the order of $10^6$ to $10^9$ streams. "Leapfrog" methods (in which successive seeds from a base generator are dealt out to the streams like playing cards from a deck) are simple, but can suffer from statistical anomalies. A number of methods use a simple linear congruential generator as the base generator, which yields an inadequate cycle length.

The most promising parallel PRNGs appear to be the SPRNG generator and the PLFG generator, each of which uses a lagged Fibonacci generator as the base generator and exploits special properties of this class of generators. A key drawback of such generators is that the seed corresponds to a "lag table" that typically comprises tens of thousands of 32 bit integers and will not fit into a record and thus cannot be used for parallelization of data-intensive simulations.

Accordingly, example embodiments take the classical "cycle splitting" approach using huge-period generators, and limit the amount of seeding information in a record by employing techniques for combining generators and for skipping ahead on a cycle. Thus, for implementing the parallelization schemes, as per the example embodiments discussed herein, specialized techniques are utilized to provide adequate seeding.

Example embodiments are described herein with respect to two simulation parallelization schemes that are applicable to simulation workloads: inter-record and intra-record parallelism. These schemes are now described. Distributed seeding techniques allowing such parallelization schemes to be employed are discussed thereafter.

Inter-record parallelism is obtained by simulating multiple records in parallel. For inter-record parallelism, a single processing node generates all of the Monte Carlo replications for a given record. Inter-record parallelism is naturally supported, for example, by Hadoop's partitioned parallelism mechanism. When there are fewer records than nodes, however, some nodes will be idle. This problem becomes particularly acute when the Monte Carlo replications are computationally expensive (such as in many financial simulations) or many replications are needed per record. In such cases, use of intra-record parallelism allows the Monte Carlo replications for a single record to be performed by multiple nodes, as described next.

For intra-record parallelism, the Monte Carlo replications for a record are conceptually partitioned into disjoint chunks. For δ chunks, the record is duplicated δ times, and each duplicate is then also called a chunk. A chunk ID and seed are stored with each chunk, and the simulation based on the chunk only generates those Monte Carlo replicates associated with the chunk. Thus, after splitting the record into chunks, different chunks, and hence different subsets of the Monte Carlo replications for the original record, can be generated asynchronously and in parallel on different nodes, allowing better load balancing. In other words, the inter-record parallelism processing method is applied, but on the multiple chunks rather than on the original records. By using this latter approach, all of the nodes in the cluster can be fully utilized at all times.

The number of chunks per record depends on the available system resources. Outside of some minor modifications, seeding and simulation proceed in the same manner as with the inter-record parallelism approach. After the multiple chunks of a single record have all been simulated, the resulting Monte Carlo replications can be merged together. Using these example parallelism schemes, both seeding and subsequent pseudo-random number stream generation must be done in a highly parallelizable manner. As no previously developed technique permits a sufficiently high degree of parallelism, flexibility in load balancing, and robustness to node failures, distributed seeding techniques utilized by example embodiments are now described.

Example embodiments utilize new methods for seeding records and for subsequently using the seeding information for purposes of record-based simulation in connection with highly parallel Monte Carlo computations. However, it should be understood that the seeding techniques described herein are equally applicable to other parallel simulation contexts.

A first method, referred to herein as SeedSkip, is based on recent skip-ahead methods for huge-period PNRGs. SeedSkip guarantees that there will be no collisions between streams of PRNG seeds consumed by different records, that is, that the streams will be mutually disjoint, and requires only a small amount of seeding information per record, making it suitable for highly parallelized computations. Further, seeding can proceed asynchronously and in parallel on multiple nodes.

Because the skip-ahead functionality is rather complex and has not yet been widely adopted, and because the method requires knowledge about simulation-procedure properties that may not be readily available, also provided is a fall-back method. The fall-back method is referred to herein as SeedMult, uses multiple PRNGs, and requires neither skip-ahead methods nor detailed knowledge about the internals of the simulation procedure. The SeedMult method does not completely rule out the possibility of collisions between streams, but it is shown herein that the probability of such collisions is vanishingly small. As with SeedSkip, seeding can proceed asynchronously and in parallel on multiple nodes.

For ease of description, it is assumed that the simulation associated with each record needs to consume only a single stream of PRNG seeds during simulation. It is also assumed that there are exactly J ($\geq 1$) nodes available to execute, in parallel, the seeding operation. These nodes are denoted by $P_0, P_1, \ldots, P_{J-1}$. For ease of description, it is initially assumed that the inter-record parallel processing scheme is used for the simulation step, so that a single node generates all of the Monte-Carlo realizations associated with a record. Under the foregoing assumptions, each record needs to be seeded with exactly one seed.

To more readily appreciate certain aspects of the SeedSkip method, a brief overview of skip-ahead techniques is first given, followed by a description of methods exploiting some characteristics of these techniques for seeding. Regarding skip-ahead techniques for PRNGs, a PRNG with seed cycle $s_0, s_1, \ldots, s_{N-1}$ supports skipping-ahead if for one or more values of v>1, it implements an efficient transformation $T^{(v)}$ such that $T^{(v)}(s_i) = s_{i+v}$ for all i. That is, the generator can skip v positions forward on the cycle without having to generate the intermediate seeds $s_{i+1}, s_{i+2}, s_{i+v-1}$. Typically, one must predetermine a desired skip length v and then pre-compute a set of generator-dependent "skip parameters" that support the desired skip length. This pre-computation is usually expensive and can be quite complicated for modern huge-period generators but, once the parameters are computed, skips of length v can be performed very efficiently, so that the pre-computation cost is amortized over many skips.

For example, many popular types of PRNGs belong to the family of "combined multiple recursive generators" (CMRGs). An individual multiple recursive generator (MRG) has a linear transformation function T. Specifically, for a seed s that is a vector of k 32-bit integers, an MRG recursively sets $s_n = A s_{n-1}$ mod m for a k×k matrix A and large integer m. A CMRG maintains k MRGs in parallel, where typically k≤4, and produces the overall random integer $r_n$ at the $n^{th}$ step by combining the k seeds $s_n^1, s_n^2, \ldots, s_n^k$, for example, by setting $r_n = (s_n^1 + s_n^2 + \ldots + s_n^k)$ mod m' for an appropriate value of m'. An efficient technique for skipping ahead by a fixed number of steps v in a CMRG has been developed. The idea is to pre-compute the matrix $A^v$ mod m using a "divide and conquer" scheme, and then exploit the fact that, for an MRG, $s_{n+v} = (A^v s_n)$ mod m = $(A^v$ mod m$)(s_n)$ mod m.

As another example, consider the recent WELL512 generator. WELL512 is a huge-period generator having a period of $2^{512}$ and improves on the statistical properties of the Mersenne Twister, a well known huge-period PRNG. WELL512 is also based on a linear recurrence, but with the modulus equal to 2, so that bits are manipulated individually. Efficient skip-ahead techniques for such generators have very recently been proposed. These techniques are nontrivial to implement, involving the representation of the linear transformation s ↦ As as a formal series, appropriately manipulating the series coefficients to represent the skip, and then effecting the actual skips using the modified series. In this case, for a given skip length, one pre-computes and stores the modified coefficients that correspond to the skip.

Figure 3A:
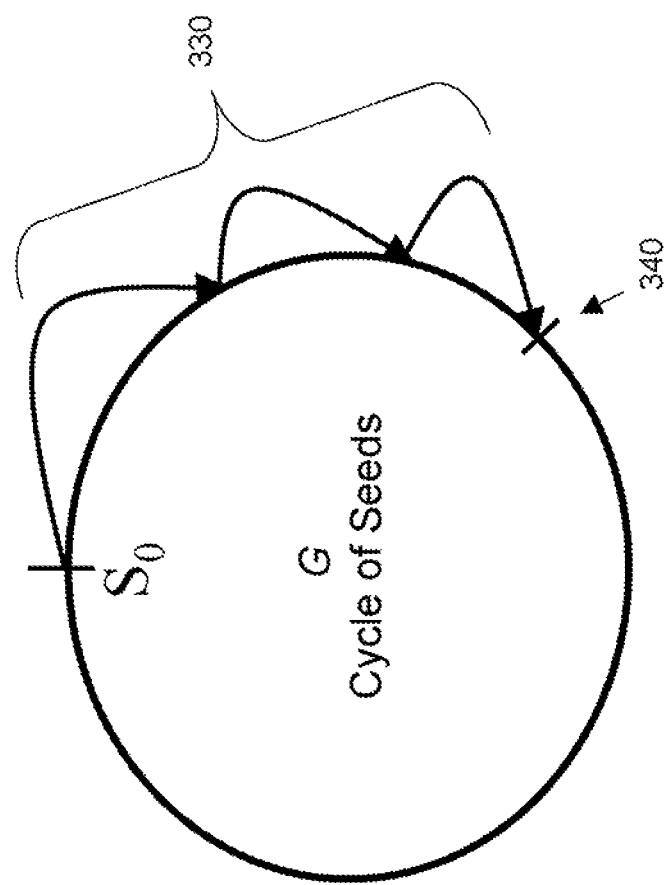
FIG. 3A illustrates an example seeding technique.
Figure 3A:
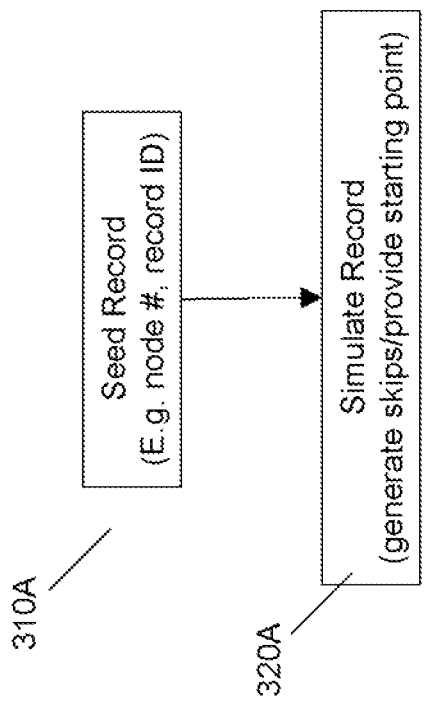

FIG. 3A illustrates an example SeedSkip skip-ahead method employed by example embodiments. The SeedSkip method employed by example embodiments uses a single PRNG for both seeding and simulation. The single PRNG (denoted by G and using WELL512 for an example implementation) requires a known upper bound k* for the number of records seeded per node. Moreover, the single PRNG requires a known upper bound of ρ* for the number of G seeds used up during any Monte Carlo replication. Recall that each record invokes the simulation procedure ω times, where ω is the number of Monte Carlo replications.

In SeedSkip, a node trivially "seeds" 310A a record with its node number and intra-node record identifier. These quantities are referred to herein as $n_p$ and $n_i$, and note that $n_p \in [0, J-1]$ and $n_i \in [0, k*-1]$. To naively simulate 320A a record, $n_p k^* + n_i$ skips 330 of length γ=ωρ* are then generated, which provides the starting point 340A on the G cycle for the simulation. To actually execute the simulation, at most γ seeds for the record are used. In fact, the number of required skips can be vastly reduced by storing a carefully selected set of skip parameters, using $O(\log_2(N/\gamma))$ storage.

Specifically, suppose that $N/\gamma = 2^j$ for some integer j. Skip parameters are computed that correspond to skip lengths $v = \gamma, 2\gamma, \ldots 2^{j-1}\gamma$. Then $O(\log_2(n_p k^* + n_i))$ skips along the G cycle are required for each record to get to the starting point for the record's simulation. That is, denoting by $b_1 b_2 \ldots b_j$ the binary representation of $n_p k^* + n_i$, execute a skip of length $2^{b_1}\gamma$ if and only if $b_1 = 1$, then execute a skip of length $2^{b_2}\gamma$ if and only if $b_2 = 1$, and so forth.

The SeedSkip method cannot be used if a good implementation of the advanced skip-ahead technology for huge-period generators is not readily available or, more importantly, if the simulation procedures are so complicated that it is impossible to obtain a reasonable upper bound on the number of seeds consumed during a Monte Carlo replication. In this case, the SeedMult seeding method can be used instead.

Figure 3B:
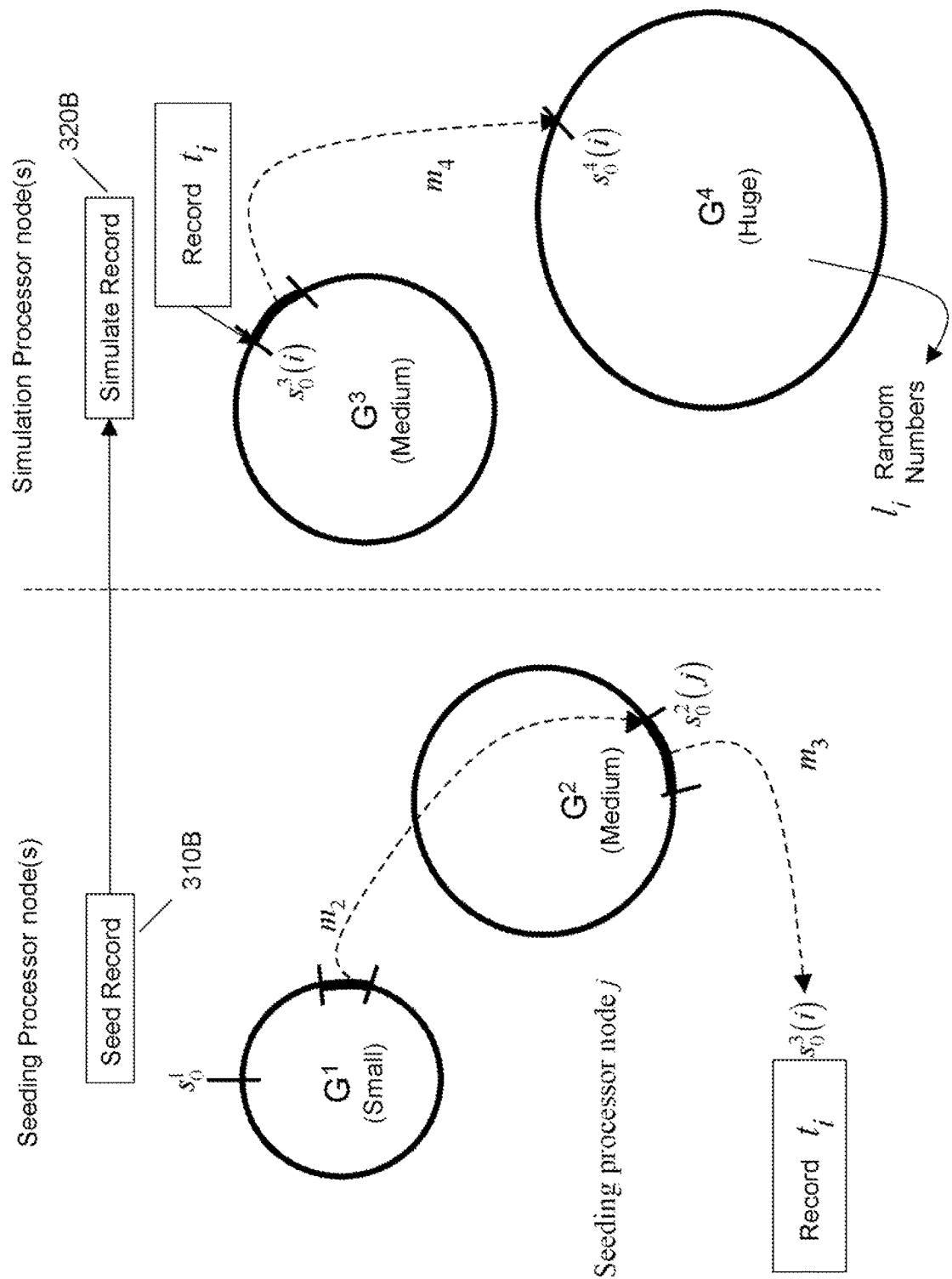
FIG. 3B illustrates an example seeding technique.

FIG. 3B illustrates an example SeedMult method employed by example embodiments. In the following, $k_j$ denotes the number of records that node $P_j$ is assigned to seed, and $l_i$ denotes the number of successive seeds consumed by record $t_i$ during a Monte Carlo replication.

The SeedMult method uses four PRNGs, denoted $G^1$-$G^4$; generators $G^1$ and $G^2$ are used for seeding, and generators $G^3$ and $G^4$ are used for simulation; it is assumed that $G^4$ is a huge-period generator. A seed $s_j^i$ for generator $G^i$ (i=1, 2, 3, 4) is an array $(s_{j,1}^i, s_{j,2}^i, \ldots, s_{j,m_i}^i)$ of $m_i$ 32-bit integers. The $j^{th}$ execution of $G^i$ updates the current seed $s_{j-1}^i$ via a transformation $s_j^i = T_1^i(s_{j-1}^i)$ and, using a second transformation, creates a 32-bit integer $r_j^i = T_2^i(s_j^i) \in \{1, 2, \ldots, 2^{32}-1\}$, which is normalized to a pseudo-random uniform number $u_j$ on [0, 1] via $u_j^i = r_j^i/2^{32}$. PRNG $G^i$ has cycle length $N_i$.

Each node $P_j$ ($0 \leq j \leq J-1$) executes the following procedure for seeding 320B its local records:

Initialize generator $G^1$ with a fixed seed $s_0^1$. All nodes use the same seed.

Generate $m_2$ (j+1) successive random integers $r_0^1, r_1^1, \ldots, r_{m_2(j+1)-1}^1$ from $G^1$, and use the last $m_2$ of these integers to form an initial seed $s_0^2(j)$ to use with $G^2$. That is, $s_0^2(j) = r_{jm_2}^1, r_{jm_2+1}^1, \ldots, r_{(j+1)m_2-1}^1)$.

Use $G^2$ to generate a sequence of $k_j m_3$ random integers $r_0^2(j), r_1^2(j), \ldots, r_{k_j m_3-1}^2(j)$, and use the $i^{th}$ subsequence of length $m_3$ to seed the $i^{th}$ local record. More specifically, setting $K_0 = 0$ and $K_l = k_1 + k_2 + \ldots + k_l$ for $l \geq 1$, seed record $t_{K_j+i}$ with $s_0^3$ ($(K_j+i) = (r_{im_3}^2(j), r_{im_3+1}^2(j), \ldots, r_{(i+1)m_3-1}^2(j))$ for $0 \leq j \leq J-1$ and $0 \leq i < k_j - 1$.

Later, at simulation time (which may be performed by the same node as used for seeding or a different node), the following procedure is used to simulate 320B record $t_i$, which has previously been seeded with seed $s_0^3(i)$ as computed above.

Initialize $G^3$ with seed $s_0^3(i)$, and use $G^3$ to generate $m_4$ successive random integers to form a seed $s_0^4(i)$.

Initialize $G^4$ with $s_0^4(i)$, and use $G^4$ to generate the $l_i$ random numbers needed by simulation associated with $t_i$.

The following result supports analysis of the SeedMult algorithm.

LEMMA 1. Consider a PRNG having a cycle of length N comprising seeds $s_1, s_2, \ldots, s_N$ and having seed transformation function T Fix K>1 and let $M_1, M_2, \ldots, M_K$ be K mutually independent random variables, each uniformly distributed on $\{1, 2, \ldots, N\}$. For $k=1, 2, \ldots, K$, define a segment $\sigma_k$ of length L ($\geq 1$) by setting $\sigma_{k,1} = s_{M_k}$ and $\sigma_{k,l} = T(\sigma_{k,l-1})$ for $2 \leq l \leq L$. Then the probability that the K segments have one or more overlaps is less than $2K^2L/N$.

The probabilities of overlaps during the seeding and simulations can now be analyzed. For the seeding process, observe that, by construction, the initial $G^2$-seeds $s_0^2(0), s_0^2(1), \ldots, s_0^2(J-1)$ for the J nodes are based on mutually disjoint segments of the $G^1$ cycle. These J seeds for $G^2$, can be viewed as being randomly placed, uniformly and independently, on the cycle for $G^2$. Each seed $s_0^2(j)$ initiates a segment of $k_j m_3$ successive seeds on the $G^2$ cycle. With $k^* = \max_{0 \leq j < J-1} k_j$, Lemma 1 implies that the probability of any overlaps between these segments is less than $\alpha_2 = 2J^2 k^* m_3/N_2$. For the simulation process, set $K = k_0 + k_1 + \ldots + k_{J-1}$ and observe that the K seeds $s_0^3(0), s_0^3(1), \ldots s_0^3(K-1)$ can be viewed as being randomly placed on the cycle for $G^3$, and the probability of any overlaps between segments (each having length $m_4$) is less than $\alpha_3 = 2K^2 m_4/N_3$. Finally, let $l^* = \max_{1 \leq i \leq K} l_i$ be the maximum number of seeds consumed by a record during a simulation, and view the K seeds $s_0^4(0), s_0^4(1), \ldots, s_0^4(K-1)$ as being randomly placed on the cycle for $G^4$. Since each seed initiates a segment of length at most $l^*$, the overlap probability is less than $\alpha_4 = 2K^2 l^*/N_4$.

With suitable choice of generators, $m_3$ can be chosen to be a small integer, so that seeding a record does not unduly increase the record size. Moreover, $\alpha_2$, $\alpha_3$, and $\alpha_4$ can be made vanishingly small, so that, effectively with probability 1, no seed is ever used more than once for any of the generators. Specifically, the generators in Table 1 can be used. When $J = 2^{10} \approx 1,000$, $k = 2^{20} \approx 1,000,000$ for $1 \leq i \leq J$ (so that there are $K = 2^{30}$, or about 1 billion records in total), and $l_i = 2^{20}$ for $1 \leq i \leq K$, then, for the above choice of generators, we have $\alpha_2 \approx 2^{-148} \approx 10^{-44}$, $\alpha_3 \approx 2^{-56} \approx 10^{-17}$, and $\alpha_4 \approx 2^{-431} \approx 10^{-129}$. Clearly, the probability of any overlaps is negligible, and only four 32-bit integers of seeding information need be stored in each record. The selected generators, besides having the requisite seed sizes and cycle lengths, are also known to have good statistical properties.

TABLE 1

Generators for seeding and simulation.

| i | Name | Seed length $m_i$ | Cycle Length $N_i$ |
|---|---|---|---|
| 1 | LCG16807 | 1 | $\approx 2^{31}$ |
| 2 | MRB32ka | 6 | $\approx 2^{191}$ |
| 3 | CLCG4 | 4 | $\approx 2^{121}$ |
| 4 | WELL512a | 16 | $\approx 2^{512}$ |

Some of the simplifying assumptions made herein can be dropped and the processes described above can be extended in several important ways.

For intra-record parallelism, the scheme uses multiple nodes to generate the N Monte Carlo replications for a record during simulation. That is, the set of Monte Carlo replications is divided into $\delta(>1)$ chunks of $\omega = N/\delta$ replications each, and these chunks are generated in parallel (by a set of J' nodes). Inter-record parallelism corresponds to the special case $\delta = 1$. The SeedSkip and SeedMult processes are modified to assign each chunk its own compressed seed. The previous descriptions and analyses still hold, except that now each $k_j$ is interpreted as the number of chunks that are seeded by node $P^j$, and $\omega$ is interpreted, as above, to be the number of Monte Carlo replications per chunk.

For multiple VG functions, suppose that we need M (>1) compressed seeds per record to perform a simulation. For example, it may be convenient to use M streams of pseudo-random numbers to represent M independent random phenomena that occur within the simulation. As with intra-record parallelism, the prior descriptions and analyses carry over virtually unchanged, except that now each (stream, chunk) pair is assigned a unique seed. With a slight abuse of terminology, henceforth the term "chunk" is used to denote such a pair (thus, there are M$\delta$ chunks in total for each record, and $k_j$ is again interpreted as the number of chunks that are seeded by $P_j$).

In terms of shared storage, if the J nodes have access to a (small) amount of shared storage, as is the case for Hadoop, then speedups for SeedMult are possible by amortizing seeding costs over multiple data-intensive simulation experiments. For example, suppose that the number of seeding nodes used per experiment is bounded above by J* over the experimental workload, and the upper bound k* on the number of chunks per node also holds for the workload. Then the seeds $s_0^2(0), s_0^2(1), \ldots, s_0^2(J^*-1)$ can be computed once and written to shared storage. These seed values can simply be looked up at seeding time (in parallel, since only read operations are involved). Similarly, the SeedSkip scheme can also exploit shared storage to amortize the initial cost of computing the skip-ahead information over an experimental workload. For example, if the values $J = 2^{10} \approx 1,000$, $k = 2^{20} \approx 1,000,000$ serve as upper bounds for the workload, then 30 sets of skip parameters are required, and these can be pre-computed and stored for use by all of the experiments.

One skilled in the art can see that hybrids of SeedMult and SeedSkip can be developed by using skip-ahead methods to place starting seeds on the $G^2$ and/or $G^3$ cycles in an equally-spaced manner, rather than dropping them randomly. Similarly, variants of SeedSkip that use fewer than four PRNGs can be developed.

As an example of scaleup for inter-record parallelism, the running times of several MCDB-style queries on increasing data sets were measured while proportionally increasing the number of servers. In this setting, each tuple is simulated using the methods described above, and then a database query is run over the results of the simulation. In the ideal case, it is expected that the running time would remain the same as the data set and number of servers are proportionally increased.

In the example case, the well known TPC-H benchmark dataset was used. The dataset was generated using the dbgen program provided by the benchmark, converted to JSON, and loaded into Hadoop's HDFS (distributed file system). Query Q1 and Q4 from Jampani et al. supra, were used (both of which are described in detail therein). Query Q1 guesses the revenue gain for products supplied by companies in a next year assuming that current sale trends hold. Query Q4 estimates the effect of a 5% customer price increase on an organization's profits.

For Queries Q1 and Q4, the number of servers was varied from 1 to 10, and 10 different datasets were prepared (from 2 GB for 1 server to 20 GB for 10 servers). For each computing-cluster size, both Q1 and Q4 were evaluated and total elapsed time was recorded. Each query was evaluated using both the SeedMult and SeedSkip distributed seeding methods, and 1000 Monte Carlo replicates were produced.

Figure 4:
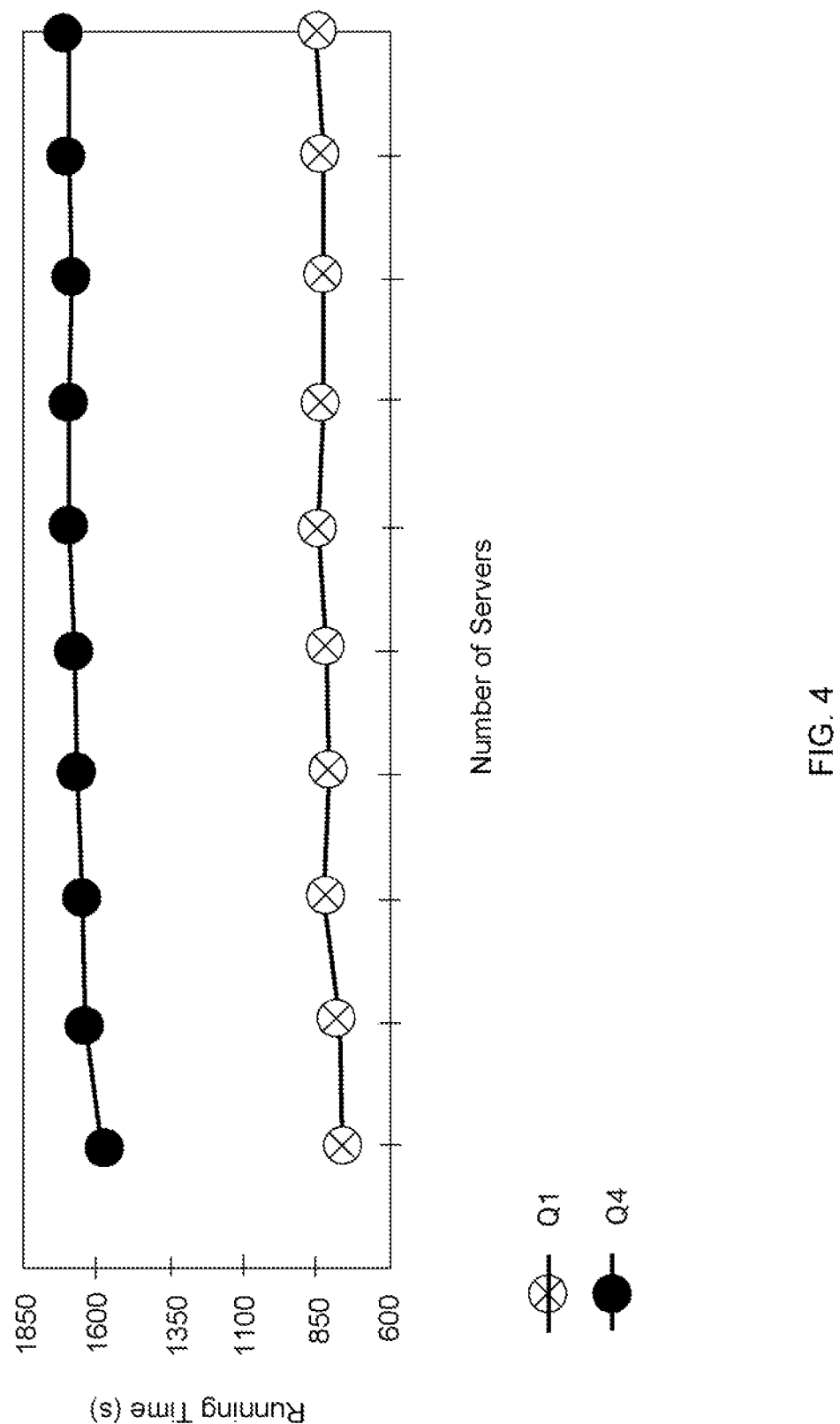
FIG. 4 illustrates example runtime results as a function of the number of servers for an example embodiment.

FIG. 4 illustrates the results for Q1 and Q4 using Seed-Skip. The illustrated execution times are the average of several runs. For both queries, the time for seeding was insignificant compared to the time for I/O, sorting, network transfer, and simulation. As a result, significant differences in overall elapsed times when SeedSkip or SeedMult were used were not observed. In isolation, it appeared that Seed-Skip was at least 5% faster than SeedMult. For both Q1 and Q4, join operations accounted for nearly 50% of the total execution time. Q1 spent most of the remaining time on record manipulation (for example, aggregating arrays) rather than on simulation. In comparison, Q4's simulation procedure was more complex, so substantially more time was spent on simulation than on record manipulation.

The network was not the bottleneck for either query. Both queries spent a large fraction of their time reading, writing, sorting, and transferring data. Q4 also spent substantial time on its CPU-intensive VG function. The curves in FIG. 4 are relatively flat, which indicates good scale-up.

Referring to FIG. 5, it will be readily understood that embodiments can be implemented using any of a wide variety of devices or combinations of devices, such as the servers (computers) described herein. An example device that may be used in implementing one or more embodiments includes a computing device in the form of a computer 510. In this regard, the computer 510 may execute program instructions configured to perform distributed seeding and highly parallelized data-intensive simulations, and perform other functionality of the embodiments, as described herein.

Components of computer 510 may include, but are not limited to, processing units 520, a system memory 530, and a system bus 522 that couples various system components including the system memory 530 to the processing unit 520. Computer 510 may include or have access to a variety of computer readable media. The system memory 530 may include computer readable storage media in the form of volatile and/or nonvolatile memory such as read only memory (ROM) and/or random access memory (RAM). By way of example, and not limitation, system memory 530 may also include an operating system, application programs, other program modules, and program data.

A user can interface with (for example, enter commands and information) the computer 510 through input devices 540. A monitor or other type of device can also be connected to the system bus 522 via an interface, such as an output interface 550. In addition to a monitor, computers may also include other peripheral output devices. The computer 510 may operate in a networked or distributed environment using logical connections to one or more other remote computers or databases, such as a cluster of machines for parallel computations. The logical connections may include a network, such local area network (LAN) or a wide area network (WAN), but may also include other networks/buses.

It should be noted as well that certain embodiments may be implemented as a system, method or computer program product. Accordingly, aspects of the invention may take the form of an entirely hardware embodiment, an entirely software embodiment (including firmware, resident software, micro-code, et cetera) or an embodiment combining software and hardware aspects that may all generally be referred to herein as a "circuit," "module" or "system." Furthermore, aspects of the invention may take the form of a computer program product embodied in one or more computer readable medium(s) having computer readable program code embodied therewith.

Any combination of one or more computer readable medium(s) may be utilized. The computer readable medium may be a computer readable signal medium or a computer readable storage medium. A computer readable storage medium may be, for example, but not limited to, an electronic, magnetic, optical, electromagnetic, infrared, or semiconductor system, apparatus, or device, or any suitable combination of the foregoing. More specific examples (a non-exhaustive list) of the computer readable storage medium would include the following: an electrical connection having one or more wires, a portable computer diskette, a hard disk, a random access memory (RAM), a read-only memory (ROM), an erasable programmable read-only memory (EPROM or Flash memory), an optical fiber, a portable compact disc read-only memory (CD-ROM), an optical storage device, a magnetic storage device, or any suitable combination of the foregoing. In the context of this document, a computer readable storage medium may be any tangible medium that can contain or store a program for use by or in connection with an instruction execution system, apparatus, or device.

A computer readable signal medium may include a propagated data signal with computer readable program code embodied therein, for example, in baseband or as part of a carrier wave. Such a propagated signal may take any of a variety of forms, including, but not limited to, electro-magnetic, optical, or any suitable combination thereof. A computer readable signal medium may be any computer readable medium that is not a computer readable storage medium and that can communicate, propagate, or transport a program for use by or in connection with an instruction execution system, apparatus, or device.

Program code embodied on a computer readable medium may be transmitted using any appropriate medium, including but not limited to wireless, wireline, optical fiber cable, RF, et cetera, or any suitable combination of the foregoing.

Computer program code for carrying out operations for aspects of the invention may be written in any combination of one or more programming languages, including an object oriented programming language such as Java™, Smalltalk, C++ or the like and conventional procedural programming languages, such as the "C" programming language or similar programming languages. The program code may execute entirely on the user's computer (device), partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider).

Aspects of the invention are described herein with reference to flowchart illustrations and/or block diagrams of methods, apparatuses (systems) and computer program products according to example embodiments. It will be understood that each block of the flowchart illustrations and/or block diagrams, and combinations of blocks in the flowchart illustrations and/or block diagrams, can be implemented by computer program instructions. These computer program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks.

These computer program instructions may also be stored in a computer readable medium that can direct a computer, other programmable data processing apparatus, or other devices to function in a particular manner, such that the instructions stored in the computer readable medium produce an article of manufacture including instructions which implement the function/act specified in the flowchart and/or block diagram block or blocks.

The computer program instructions may also be loaded onto a computer, other programmable data processing apparatus, or other devices to cause a series of operational steps to be performed on the computer, other programmable apparatus or other devices to produce a computer implemented process such that the instructions which execute on the computer or other programmable apparatus provide processes for implementing the functions/acts specified in the flowchart and/or block diagram block or blocks.

This disclosure has been presented for purposes of illustration and description but is not intended to be exhaustive or limiting. Many modifications and variations will be apparent to those of ordinary skill in the art. The example embodiments were chosen and described in order to explain principles and practical application, and to enable others of ordinary skill in the art to understand the disclosure for various embodiments with various modifications as are suited to the particular use contemplated.

Although illustrated example embodiments have been described herein with reference to the accompanying drawings, it is to be understood that embodiments are not limited to those precise example embodiments, and that various other changes and modifications may be affected therein by one skilled in the art without departing from the scope or spirit of the disclosure.

What is claimed is:

1. A method comprising:
utilizing at least one processor to execute computer code configured to perform the steps of:
assigning records of a database for seeding to one of a plurality of parallel-processing nodes, wherein each of the records is assigned to a single of the plurality of parallel-processing nodes;
at each of and in parallel with the plurality of parallel-processing nodes, seeding each record using the node assigned to the record, said seeding further comprising adding a unique source of pseudo-random numbers to each record, wherein the unique source of pseudo-random numbers is stored within a corresponding record; and
providing, using a cycle of seeds, seeded records to a plurality of processing nodes for parallel asynchronous simulations, wherein the plurality of processing nodes is different from the plurality of parallel-processing nodes, wherein each of the seeded records is provided to a single of the plurality of processing nodes, wherein the providing comprises:
with respect to the cycle of seeds, generating skips of varied length based on the records of the database; and
modifying, based on the generated skips of varied length, a start point for a cycle of at least one simulation; and
each of the seeded records undergoing a single simulation, wherein the pseudo-random number of the corresponding record is utilized during the simulation.

2. The method according to claim 1, wherein assigning records of a database for seeding further comprises assigning records to a plurality of processing nodes for seeding independently and asynchronously.

3. The method according to claim 1, wherein the unique source of pseudo-random numbers further comprises a compressed seed for a pseudo-random number generator.

4. The method according to claim 1, wherein the parallel asynchronous simulations further comprise, a plurality of simulations, each executed in accordance with a given seeded record by at least one of the plurality of processing nodes.

5. The method according to claim 1, wherein adding a unique source of pseudo-random numbers to each record further comprises adding a source of pseudo-random numbers to each record enabling each of the plurality of processing nodes to generate pseudo-random numbers locally for a simulation.

6. The method according to claim 1, wherein adding a unique source of pseudo-random numbers to each record further comprises providing a compressed seed to each record enabling each of the plurality of processing nodes to generate a disjoint sequence of pseudo-random numbers for the record using a skip-ahead technique for a single pseudo-random number generator locally.

7. The method according to claim 6, wherein using a skip-ahead technique further comprises pre-computation of a set of skip parameters whose size is a logarithmic function of the cycle length of the pseudo-random number generator.

8. The method according to claim 1, wherein providing a unique source of pseudo-random numbers to each record further comprises providing a compressed seed to each record enabling each of the plurality of processing nodes to locally generate a sequence of pseudo-random numbers for the record that, above a given probability, is disjoint from a sequence for all other records, using a technique based on multiple pseudo-random number generators.

9. The method according to claim 1, further comprising receiving simulation results from parallel asynchronous simulations executed with the plurality processing nodes using the seeded records and recording the simulation results.

10. The method according to claim 1, wherein said providing of seeded records comprises employing a single pseudo-random number generator to provide seeded records to a plurality of processing nodes for parallel asynchronous simulations and for performing at least one simulation.

11. The method according to claim 10, wherein to provide seeded records to a plurality of processing nodes for parallel asynchronous simulations comprises seeding a record with a node number and intra-node record identifier.

* * * * *